(12) United States Patent
Li et al.

(10) Patent No.: US 11,293,869 B2
(45) Date of Patent: Apr. 5, 2022

(54) CORE-SHELL HETEROSTRUCTURES COMPOSED OF METAL NANOPARTICLE CORE AND TRANSITION METAL DICHALCOGENIDE SHELL

(71) Applicant: Northwestern University, Evanston, IL (US)

(72) Inventors: Yuan Li, Evanston, IL (US); Xinqi Chen, Northbrook, IL (US); Vinayak P. Dravid, Glenview, IL (US)

(73) Assignee: Northwestern University, Evanston, IL (US)

( * ) Notice: Subject to any disclaimer, the term of this patent is extended or adjusted under 35 U.S.C. 154(b) by 191 days.

(21) Appl. No.: 16/329,280

(22) PCT Filed: Sep. 1, 2017

(86) PCT No.: PCT/US2017/049826
§ 371 (c)(1),
(2) Date: Feb. 28, 2019

(87) PCT Pub. No.: WO2018/045271
PCT Pub. Date: Mar. 8, 2018

(65) Prior Publication Data
US 2019/0250101 A1    Aug. 15, 2019

Related U.S. Application Data

(60) Provisional application No. 62/383,191, filed on Sep. 2, 2016.

(51) Int. Cl.
*G01N 21/64* (2006.01)
*C23C 16/30* (2006.01)
(Continued)

(52) U.S. Cl.
CPC ....... *G01N 21/648* (2013.01); *C23C 14/0021* (2013.01); *C23C 14/0623* (2013.01);
(Continued)

(58) Field of Classification Search
None
See application file for complete search history.

(56) References Cited

FOREIGN PATENT DOCUMENTS

| CN | 104492460 A | 4/2015 |
|---|---|---|
| CN | 104971744 A | 10/2015 |

OTHER PUBLICATIONS

Li et al., "Au@MoS2 Core-Shell Heterostructures with Strong Light-Matter Interactions," Nano Letters, vol. 16, No. 12, Dec. 14, 2016, pp. 7696-7702.

(Continued)

*Primary Examiner* — Ronak C Patel
(74) *Attorney, Agent, or Firm* — Bell & Manning, LLC (57) ABSTRACT

Provided herein are core-shell heterostructures design comprising a metal (e.g., noble metal) nanoparticle core and a transition metal dichalcogenide (TMD) shell, and methods of preparation and use thereof. In particular embodiments, the core-shell heterostructures described herein are synthesized by direct growth of a monolayer or multilayer fullerene-like TMD shell on a metal (e.g., noble metal) nanoparticle core, exhibit unique Raman scattering and photoluminescence characteristics, and are useful, for example, in plasmonic hot electron enhanced optics and optoelectronics.

11 Claims, 12 Drawing Sheets

(51) Int. Cl.

| | |
|---|---|
| C23C 16/56 | (2006.01) |
| C23C 16/44 | (2006.01) |
| C23C 14/18 | (2006.01) |
| H01L 31/032 | (2006.01) |
| H01L 31/0384 | (2006.01) |
| G01N 21/65 | (2006.01) |
| H01M 4/36 | (2006.01) |
| C23C 14/06 | (2006.01) |
| C23C 14/00 | (2006.01) |
| C23C 14/24 | (2006.01) |
| H01M 4/38 | (2006.01) |
| H01M 4/58 | (2010.01) |
| H01M 4/583 | (2010.01) |

(52) U.S. Cl.
CPC .............. *C23C 14/18* (2013.01); *C23C 14/24* (2013.01); *C23C 16/305* (2013.01); *C23C 16/4417* (2013.01); *C23C 16/56* (2013.01); *G01N 21/658* (2013.01); *H01L 31/032* (2013.01); *H01L 31/0384* (2013.01); *H01M 4/36* (2013.01); *H01M 4/38* (2013.01); *H01M 4/581* (2013.01); *H01M 4/583* (2013.01)

(56) References Cited

OTHER PUBLICATIONS

International Search Report and Written Opinion dated Nov. 7, 2017, 9 pages.
Li et al., "Active Light Control of the MoS2 Monolayer Exciton Binding Energy," ACS Nano, vol. 9, No. 10, 2015, pp. 10158-10164.
Bhanu et al., "Photoluminescence quenching in gold—MoS2 hybrid nanoflakes," Scientific Reports, vol. 4, No. 5575, 2014, pp. 1-5.
Lee et al., "Plasmonic Gold Nanorods Coverage Influence on Enhancement of the Photoluminescence of Two-Dimensional MoS2 Monolayer," vol. 5, No. 16374, 2015, pp. 1-9.
Fang et al., "Graphene-Antenna Sandwich Photodetector," Nano Letters, vol. 12, 2012, pp. 3808-3813.
Butun et al. "Enhanced Light Emission from Large-Area Monolayer MoS2 Using Plasmonic Nanodisc Arrays," Nano Letters, vol. 15, 2015, pp. 2700-2704.

CORE-SHELL HETEROSTRUCTURES COMPOSED OF METAL NANOPARTICLE CORE AND TRANSITION METAL DICHALCOGENIDE SHELL

CROSS-REFERENCE TO RELATED APPLICATION

This application is a National Stage of International Application No. PCT/US17/49826, filed Sep. 1, 2017, which claims the benefit of U.S. Patent Application No. 62/383,191, filed Sep. 2, 2016, the contents of which are herein incorporated by reference.

FIELD

Provided herein are core-shell heterostructures comprising a metal nanoparticle core and a transition metal dichalcogenide (TMD) shell, and methods of preparation and use thereof. In particular embodiments, the core-shell heterostructures described herein are synthesized by direct growth of a monolayer or multilayer fullerene-like TMD shell on a metal (e.g., noble metal) nanoparticle core, exhibit unique Raman scattering and photoluminescence characteristics, and are useful, for example, in plasmonic hot electron enhanced optics and optoelectronics.

BACKGROUND

There exists a need to develop devices and materials for optoelectronics, optical imaging, and other energy-environmental applications.

SUMMARY

Provided herein are core-shell heterostructures comprising a metal (e.g., noble metal) nanoparticle core and a transition metal dichalcogenide (TMD) shell, and methods of preparation and use thereof. In particular embodiments, the core-shell heterostructures described herein are synthesized by direct growth of a monolayer or multilayer fullerene-like TMD shell on a metal (e.g., noble metal) nanoparticle core, exhibit unique Raman scattering and photoluminescence characteristics, and are useful, for example, in plasmonic hot electron enhanced optics and optoelectronics.

In some embodiments, provided herein are compositions comprising a metal (e.g., noble metal) core and monolayer or multilayer transition metal dichalcogenide (TMD) shell (e.g., Au@MoS$_2$ core-shell heterostructures comprising Au nanoparticles encapsulated within a MoS$_2$ shell). In some embodiments, the metal core comprises a noble metal and is a single phase or alloy of gold (Au), silver (Ag), platinum (Pt), Palladium (Pd), Ruthenium (Ru), Rhodium (Rh), Iridium (Ir), and/or Osmium (Os). In some embodiments, the metal core comprises a transition metal such as zinc (Zn), cadmium (Cd), iron (Fe), nickel (Ni), titanium (Ti), scandium (Sc), chromium (Cr), cobalt (Co), etc. In some embodiments, a metal core comprise noble and transition metals or alloys thereof. In some embodiments, the TMD shell is a monolayer or multilayer fullerene-like shell. In some embodiments, the TMD is a single or composite semiconductor of the type MX$_2$, with M a transition metal atom (Mo, W, etc.) and X a chalcogen atom (S, Se, or Te). Typical examples of TMD include molybdenum disulfide (MoS$_2$), tungsten disulfide (WS$_2$), rhenium disulfide (ReS$_2$), molybdenum diselenide (MoSe$_2$), tungsten diselenide (WSe$_2$), and/or Molybdenum ditelluride (MoTe$_2$). In some embodiments, the TMD shell comprises 1-50 layers (e.g., 1, 2, 4, 6, 8, 10, 12, 14, 16, 18, 20, 25, 30, 35, 40, 45, 50, or ranges therebetween). In some embodiments, the noble metal nanoparticles are 5-200 nm in diameter (e.g., 5, 20, 25, 30, 35, 40, 45, 50, 55, 60, 65, 70, 75, 80, 85, 90, 95, 100, 150, 200 or ranges therebetween). In some embodiments, the MoS$_2$ shell is 0.65-32.5 nm thick (e.g., 0.65, 1.95, 3.25, 4.55, 5.85, 7.15, 8.45, 9.75, 11.05, 12.35, 13.65, 14.95, 16.25, 17.55, 18.85, 20.15, 21.45, 22.75, 24.05, 25.35, 26.65, 27.95, 29.25, 30.55, 31.85, 32.5 or ranges therebetween).

In some embodiments, provided herein are methods for preparing the core-shell heterostructures described herein comprising directly growing a monolayer or multilayer TMD shell on a metal (e.g., noble metal) nanoparticle core. In some embodiments, the multilayer TMD shell is grown by chemical vapor deposition. In some embodiments, metal (e.g., noble metal) nanoparticles are formed by coating metal (e.g., noble metal) film onto a silicon (Si) substrate via galvanic deposition or physical evaporation followed by high-temperature annealing. In some embodiments, the metal (e.g., noble metal) nanoparticles are commercially available metal (e.g., noble metal) nanoparticles. In some embodiments, a metal (e.g., noble metal) nanoparticle-coated Si substrate (e.g., Au nanoparticle-coated Si substrate) is placed in a tube furnace and transition metal oxide and sulfur powder is carried over the substrate to form TMD shells on the nanoparticles.

In some embodiments, provided herein are photodetector devices comprising the metal@TMD (e.g., noble-metal@TMD (e.g., Au@MoS$_2$, etc.), etc.) core-shell heterostructures described herein.

In some embodiments, provided herein are compositions comprising the core-shell heterostructures described herein, patterned onto a substrate. In some embodiments, the noble metal (e.g., Au, etc.) nanoparticles encapsulated within a TMD (e.g., MoS$_2$) shell are deposited onto the substrate using a standard photolithography process.

In some embodiments, provided herein is the use of the metal@TMD (e.g., noble-metal@TMD (e.g., Au@MoS$_2$, etc.), etc.) core-shell heterostructures described herein in plasmonic hot electron enhanced optics and/or optoelectronics.

DEFINITIONS

Although any methods and materials similar or equivalent to those described herein can be used in the practice or testing of embodiments described herein, some preferred methods, compositions, devices, and materials are described herein. However, before the present materials and methods are described, it is to be understood that this invention is not limited to the particular molecules, compositions, methodologies or protocols herein described, as these may vary in accordance with routine experimentation and optimization. It is also to be understood that the terminology used in the description is for the purpose of describing the particular versions or embodiments only, and is not intended to limit the scope of the embodiments described herein.

Unless otherwise defined, all technical and scientific terms used herein have the same meaning as commonly understood by one of ordinary skill in the art to which this invention belongs. However, in case of conflict, the present specification, including definitions, will control. Accordingly, in the context of the embodiments described herein, the following definitions apply.

As used herein and in the appended claims, the singular forms "a", "an" and "the" include plural reference unless the context clearly dictates otherwise. Thus, for example, reference to "a nanoparticle" is a reference to one or more nanoparticles and equivalents thereof known to those skilled in the art, and so forth.

Many embodiments herein are described using open "comprising" language. Such embodiments encompass multiple closed "consisting of" and/or "consisting essentially of" embodiments, which may alternatively be claimed or described using such language.

As used herein, the term "plasmonic nanoparticles" refers to metal particles (e.g., gold (Au), silver (Ag), platinum (Pt), palladium (Pd), ruthenium (Ru), rhodium (Rh), osmium (Os), iridium (Ir), alloys thereof, etc.) with electron density that can couple with electromagnetic radiation of wavelengths that are larger than the particle due to the nature of the dielectric-metal interface between the medium and the particle. Plasmonic nanoparticles differ from conventional surface plasmons in that their scattering, absorbance, and/or coupling properties are dependent upon their specific geometries and the media in which they reside. Plasmonic nanoparticles typically exhibit very strong absorption and scattering spectra that are tunable by altering the shape, the composition, or the medium around their nanoparticle surface.

DETAILED DESCRIPTION

Provided herein are core-shell heterostructures design comprising a metal (e.g., noble metal) nanoparticle core and a transition metal dichalcogenide (TMD) shell, and methods of preparation and use thereof. In particular embodiments, the core-shell heterostructures described herein are synthesized by direct growth of a monolayer or multilayer fullerene-like TMD shell on a metal (e.g., noble metal) nanoparticle core, exhibit unique Raman scattering and photoluminescence characteristics, and are useful, for example, in plasmonic hot electron enhanced optics and optoelectronics.

In some embodiments, the core-shell heterostructures described herein (e.g., noble-metal@TMD heterostructures described herein (e.g., Au@MoS$_2$ heterostructures, etc.)) exhibit interesting optical properties and behavior. The material synthesis was realized by direct growth of monolayer or multilayer fullerene-like TMD shell on metal (e.g., noble metal) nanoparticle core. As an example of the broader class of metal@TMD (e.g., noble-metal@TMD) heterostructures, the Au@MoS$_2$ heterostructures are found to exhibit strong light-matter interactions, for example, due to the structural curvature of MoS$_2$ shell and the plasmonic effect from the underlying Au nanoparticle cores; although embodiments herein are not limited to any particular mechanism of action and an understanding of the mechanism of action is not necessary to practice such embodiments. Significantly enhanced Raman scattering and photoluminescence emission were observed on Au@MoS$_2$ heterostructures. Such enhancement is attributed to the surface plasmon-induced electric filed, which mainly accumulates within the MoS$_2$ shell. Experiments conducted during development of embodiments herein also indicated charge transfer-induced p-type doping of the MoS$_2$ shell. DFT calculation further reveals that the structural curvature of MoS$_2$ shell leads to a modification of its electronic structure, which facilitates the charge transfer from MoS$_2$ to Au core. These experiments indicate that noble-metal@TMD heterostructures generally will exhibit similar optical properties and characteristics.

The noble-metal@TMD heterostructures (e.g., Au@MoS$_2$ core-shell heterostructures) described herein find use, for example in optoelectronic devices, optical imaging, and other energy-environmental applications. In some embodiments, the noble-metal@TMD heterostructures (e.g., Au@MoS$_2$ core-shell heterostructures) are plasmonic nanostructures.

EXPERIMENTAL

Example 1

Materials and Methods

Reagents

Molybdenum trioxide and Sulfur powders were purchased from Alfa Aesar (ward Hill, Mass.). Galvanic deposition solution contains 1 mM KAuCl$_4$ and 1% HF. Buffered oxide etch (BOE) was self-prepared by mixing 40% NH$_4$F and 49% HF with a volume rate of 6:1. Chemical vapor deposition was conducted in a Lindberg Blue M tube furnace. Heidelberg μPG 501 Maskless Aligner was used for the lithography preparation of Au@MoS$_2$ patterns on Si substrate as well as the fabrication of photodetector devices. Raman spectra and photoluminescence spectra was collected on the HORIBA LabRAM HR Evolution Confocal Raman System. Electric test was conducted on the Signatone S-1160 Probe Station. X-ray photoelectron spectroscopy (XPS, Thermo Scientific ESCALAB 250Xi) was used for binding energy analysis. Hitachi SU8030 SEM and JEOL JEM-2100 Fas TEM were used for morphological and structural characterizations.

Chemical Vapor Deposition of Au@MoS$_2$ Heterostructures

Si substrate was cleaned with BOE for 15 s to remove surface oxide layer. This was followed by putting the substrate in above galvanic deposition solution for 60 s to deposit Au film, which was further annealed at 850° C. for 15 min to form Au nanoparticles. The following fullerene-like MoS$_2$ shell encapsulation on Au nanoparticles were conducted via a modified chemical vapor deposition process. The Au nanoparticle-coated substrate was put face down on an alumina boat containing 10 mg MoO$_3$. Another boat containing 120 mg sulfur powders was put in the upstream side. N$_2$ gas with a flow rate of 200 sccm was used as the carrier gas. The furnace was first heated up to 300° C. and kept for 30 min, and then ramped to the growth temperature (650° C.). The growth was continued for 15 min with a N$_2$ flow rate of 10 sccm. The furnace was then slowly cooled down to ambient temperature.

Fabrication of "NU" Patterns of Au@MoS$_2$ Heterostructures

Designed patterns of Au@MoS$_2$ heterostructures were fabricated using a standard photolithography process. Photoresist (S1813) was first coated on Si substrate with a spin rate of 4000 rpm for 30 s. The substrate was baked at 110° C. for 1 min. UV light exposure was conducted for 26 ms with a defocus of −1. The sample was then developed in MF-319 for 30 s and further cleaned with O$_2$/Ar plasma for 3 min. Subsequently, an Au film of 10 nm was evaporated on the substrate and the remaining photoresist was removed in acetone. The obtained Au film patterns was annealed at 850° C. for 15 min and subjected to the same chemical vapor deposition process as above to form Au@MoS$_2$ patterns. The obtained patterns at various fabrication steps can be found in FIG. 8.

Discrete Dipole Approximation (DDA) Modeling

Figure 3:
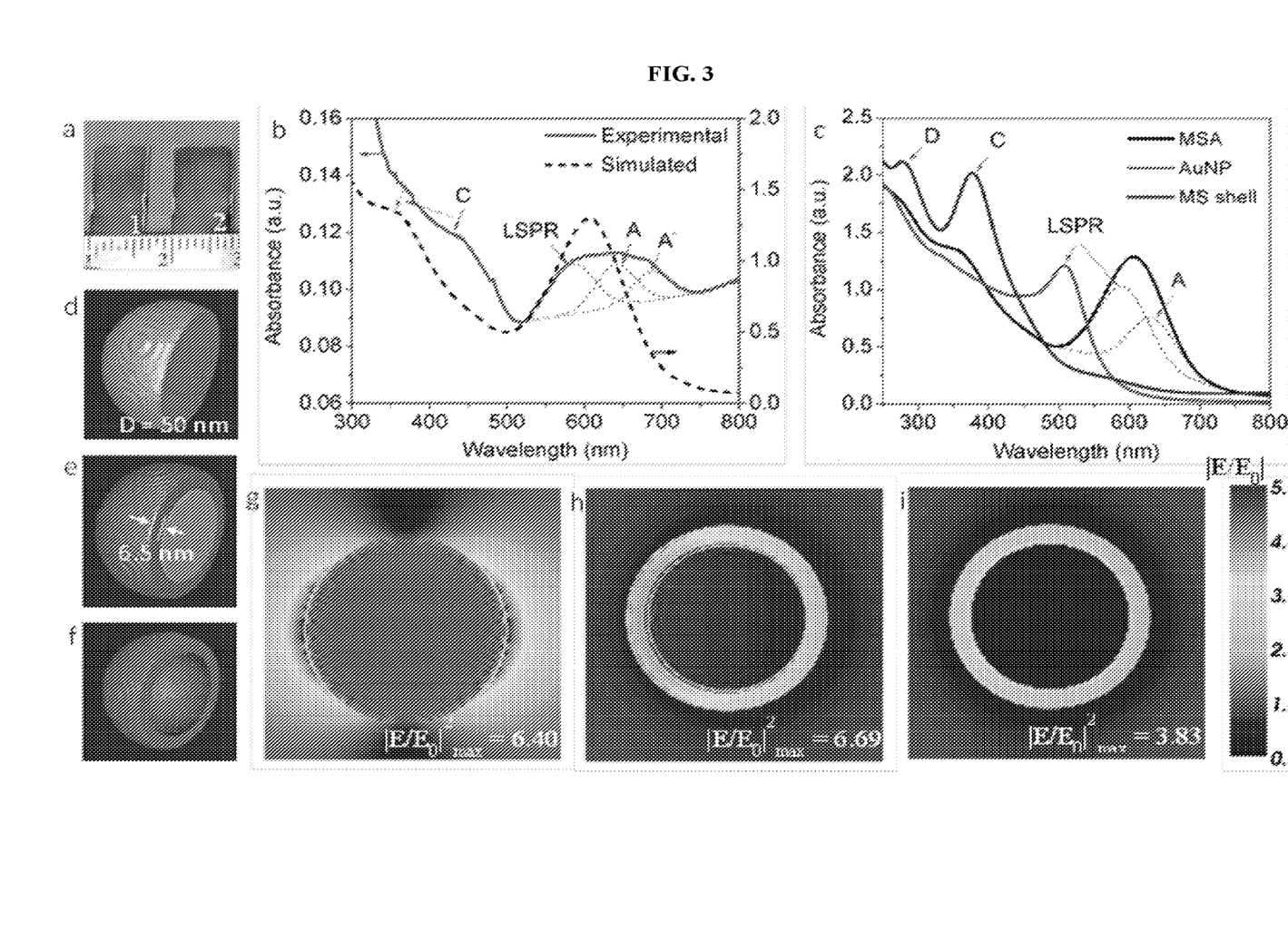
FIG. 3. Field enhancement on the Au@MoS$_2$ heterostructures. (a) Optical images of Au nanoparticles (1) and Au@MoS$_2$ heterostructures (2) grown on Si substrate. (b) Experimental and simulated absorbance spectra of the Au@MoS$_2$ heterostructures. (c) Simulated absorbance spectra of Au@MoS$_2$ heterostructures, Au nanoparticles and imaginary MoS$_2$ shell. (d-f) 3D images showing the three targets (partial) used for DDA modeling. (g-i) Normalized electric field maps on target of Au nanoparticles (g), Au@MoS$_2$ heterostructure (h), and the imaginary MoS$_2$ shell (i).

The computation of absorbance and surface electric field distribution of isolated targets (Au nanoparticle, Au@MoS$_2$ heterostructure, and imaginary MoS$_2$ shell, see FIG. 3D-F) were performed using the Discrete Dipole Approximation algorithm implemented in the DDSCAT 7.2 code developed by Draine and Flatau. The Au nanoparticle target has a diameter of 50 nm. The Au@MoS$_2$ heterostructure target is composed of an Au nanoparticle core of 50 nm and a MoS$_2$ shell of 6.5 nm (10 atomic layers of MoS$_2$). The imaginary MoS$_2$ shell target is same with the Au@MoS$_2$ heterostructure target but with no Au core. These targets were built as a lattice of polarizable cubic elements or dipoles with position $r_i$ and possibility $\alpha_i$ (i=1, 2, . . . , N). In the simulation, the targets were excited by a monochromatic incident wave vertical to the cross-section of the heterostructures, and the induced extinction and absorption of the targets were calculated by $$C_{abs} = \frac{4\pi k}{|E_0|^2} \sum_{i=1}^{N} \left\{ \text{Im}[P_i(\alpha_i^{-1})^* P_i^*] - \frac{2k^3}{3}|P_i|^2 \right\} \quad (1)$$

here * represents complex conjugate, $$k = \frac{2\pi}{\lambda}$$

is the wave number of the incident wave and $E_0$ is its amplitude, $E_{loc,i}$ is the local field calculated from the sum of the incident radiation field of dipole i and the filed radiated by the other N−1 dipoles, and $P_i$ is the polarization induced in dipole i, expressed as $$P_i = \alpha_i E_{loc,i}(r_i) \quad (2)$$

Figure 5:
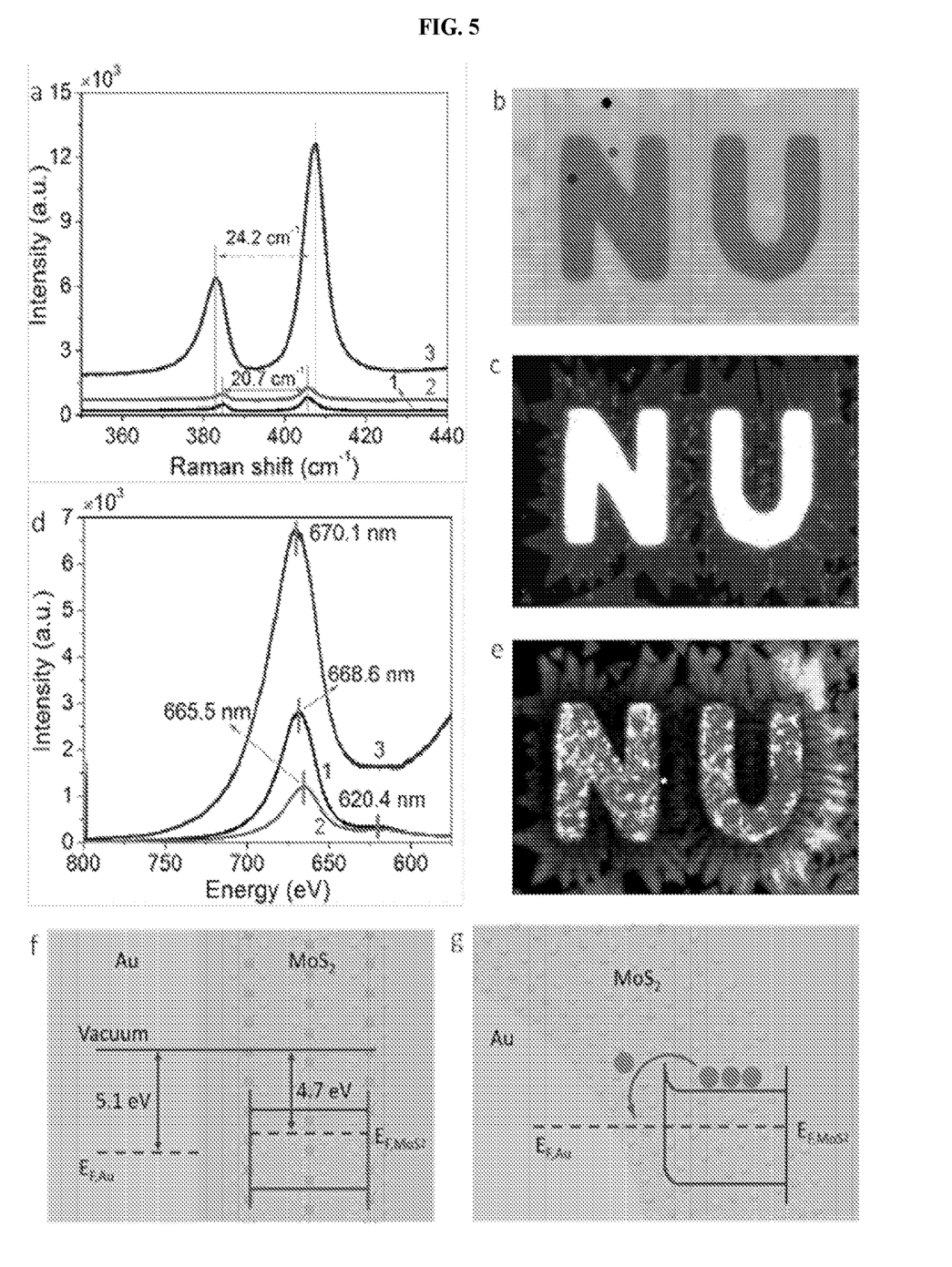
FIG. 5. Surface plasmon-induced light-matter interaction on Au@MoS$_2$ patterns. (a) Raman spectra and (b) photoluminescence spectra obtained at different locations that marked in the optical image of "NU" patterns in (c). (d) Raman map and (e) photoluminescence map generated on the "NU" patterns. (f) Schematic illustrating the band structure of Au and MoS$_2$ before combination. (g) Realigned band structure in the Au@MoS$_2$ heterostructures.

The absorption efficiency ($Q_{abs}$) of the simulated targets (FIG. 5A) were calculated from $$Q_{abs} = C_{abs}/(\pi a_{eff}^2) \quad (3)$$

where $a_{eff}$ is the effective radius of a sphere with volume $$\left(\frac{4\pi a_{eff}^3}{3}\right)$$

equal to the volume of the heterostructured targets.

As mentioned, the strong light-matter interaction at the visible region leads to the generation of SPR, which further forms a constant localized electric field on/near the surface of the targets. The intensity of electric filed was theoretically calculated from the sum of the incident radiation field of dipole i and the filed radiated by the other N−1 dipoles, as shown in the following equation, $$E_{loc,i}(r_i) = E_{inc,i} + E_{dip,i} = E_0 \exp(ikr_i) - \Sigma_{j\neq i} A_{ij} P_j. \quad (4)$$

The interaction matrix A can be represented as $$A_{ij}P_j = \frac{\exp(ik|r_{ij}|)}{|r_{ij}|^3}\left\{k^2 r_{ij}\times(r_{ij}\times P_j) + \frac{1-ik|r_{ij}|}{|r_{ij}|^2}\times[|r_{ij}|^2 P_i - 3r_{ij}(r_{ij}P_j)]\right\} \quad (5)$$
$$j = 1, 2, \ldots, N, j \neq i$$

where $|r_{ij}|=|r_i-r_j|$ and P is the polarization vector.

Density Functional Theory Calculation

Density functional theory (DFT) electronic structure calculations were performed in order to gain insights into the various band alignments in these materials. The calculations were performed using the generalized gradient approximation with PBE functional for the exchange correlation functional and projector augmented wave potentials as implemented in VASP (Vienna Ab-initio Simulation Package). All structures are fully relaxed with respect to cell vectors and cell-internal positions. The electronic DOS (density of states) is calculated from the relaxed structures using the tetrahedron method with Blöchl corrections. To get the Fermi level relative to the vacuum level of Au, 6-layer slab of fcc Au in (111) direction with 15 Angstrom vacuum in the super cell was used to calculate work function. To assess the relative band alignments of $MoS_2$ system, the findings of Van de Walleand and Neugebauer, who demonstrated a universal alignment of the electronic transition level of hydrogen in a wide range of materials including semiconductors, insulators and even aqueous solutions were utilized. Hence, to infer the band alignment, the energies of H defects in the rock salt compounds of interest were computed, alignment between these H energies was assumed, and the band alignment of the compounds was extracted. To align the valance band maximum position of each system, the defect formation energies of various charge states of interstitial Hq (q=−1, 0, 1) was considered by placing H in the host material, calculating the total energy of this structure, and subtracting the energy of the corresponding pure host material, hydrogen chemical potential, and electron chemical potential:

$$E_f(Hq)=E_{tot}(Hq)-E_{tot}(\text{bulk})-0.5E_{tot}(H_2)+q(E_V+\Delta E+E_F),$$

where $E_V$ and $E_F$ are valence band maximum and Fermi level (relative to the VBM). To select the most favorable interstitial H binding sites in host materials, multiple binding configurations are calculated. The electrostatic potential correction term $\Delta E$ is calculated by inspecting the potential in the supercell far from the impurity and aligning it with the electrostatic potential in bulk.

Example 2

Results

Figure 1:
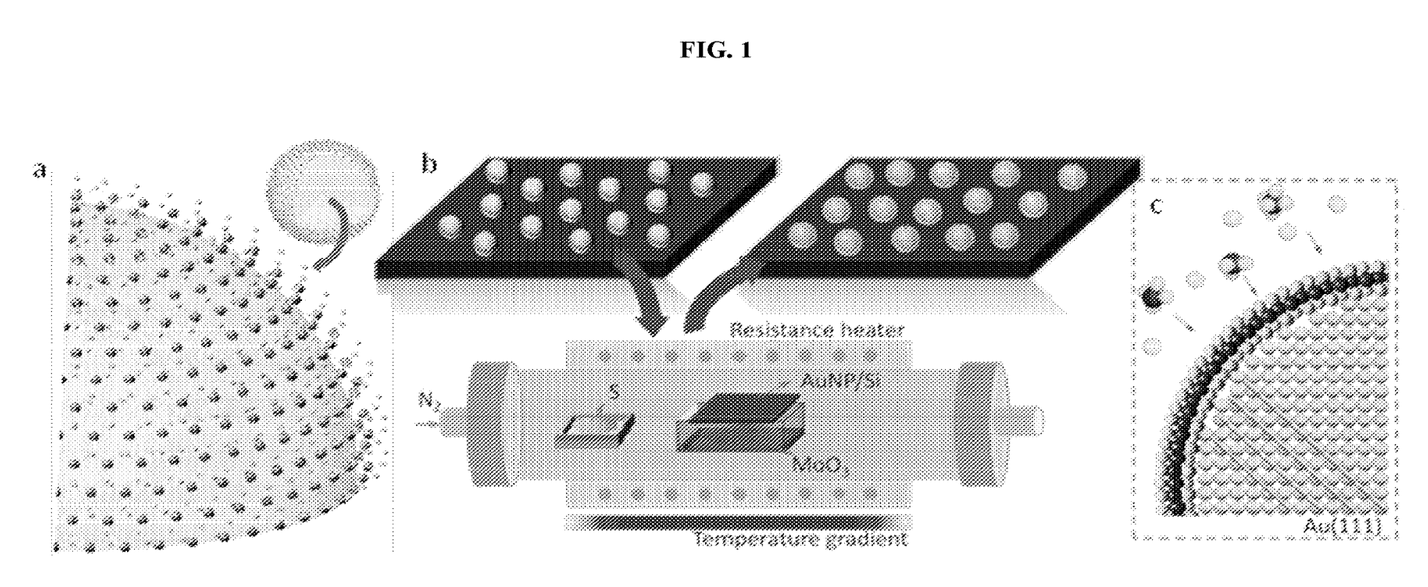
FIG. 1. CVD synthesis of Au@MoS$_2$ core-shell heterostructures. (a) Schematic illustrating the core-shell structure. (b,c) Schematic showing the CVD process of MoS$_2$ shell growth on Au nanoparticles. (d) SEM image of the Au@MoS$_2$ heterostructures on Si substrate. (e-g) TEM images and diffraction patterns of the Au@MoS$_2$ heterostructures. (h-k) STEM and corresponding EDS mapping of the Au@MoS$_2$ heterostructures.
Figure 6:
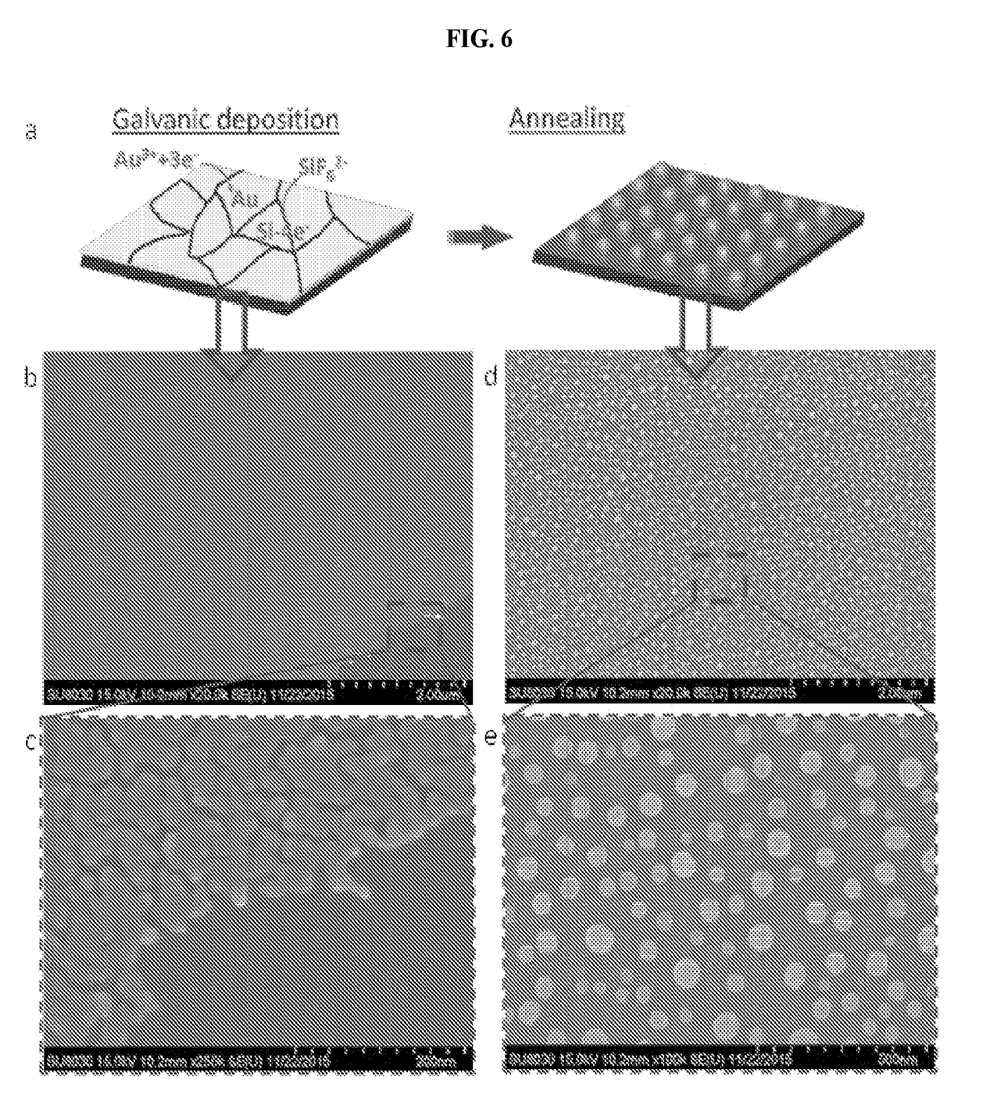
FIG. 6. Formation and dispersion of Au nanoparticles on Si substrate. (a) Schematic showing the galvanic deposition of Au film and its subsequent annealing to form dewetted Au nanoparticles. (b,c) SEM images of the as-deposited Au film. (d,e) SEM images of the annealed Au nanoparticles.

A modified chemical vapor deposition method was employed to realize the growth of a fullerene-like $MoS_2$ shell on Au nanoparticles. An Au film with a thickness of ~10 nm was first coated on fresh Si substrate via a galvanic deposition approach (FIG. 6a). The Au film was further subjected to a high-temperature annealing process to form Au nanoparticles. The morphology of the Au film, as well as the obtained Au nanoparticles are shown in FIG. 6b-e. These Au nanoparticles have an average size of 52.1±9.1 nm. The subsequent chemical vapor deposition of the $MoS_2$ shell is similar to previous reports. FIG. 1a shows a schematic of the obtained Au@$MoS_2$ core-shell heterostructures. The growth process and furnace setup are further illustrated in FIG. 1b. The Au nanoparticle coated Si substrate was placed face down on an alumina boat containing $MoO_3$. Another boat with sulfur powders were placed in the upstream region of the furnace. During the growth, volatile $MoO_3$ and its partially decomposed suboxides ($MoO_x$) react with sulfur vapor and form $MoS_2$ shell on Au nanoparticles (FIG. 1c). Due to the high affinity of Au and S atoms, complete encapsulation of $MoS_2$ on the Au surface is realized.

Figure 7:
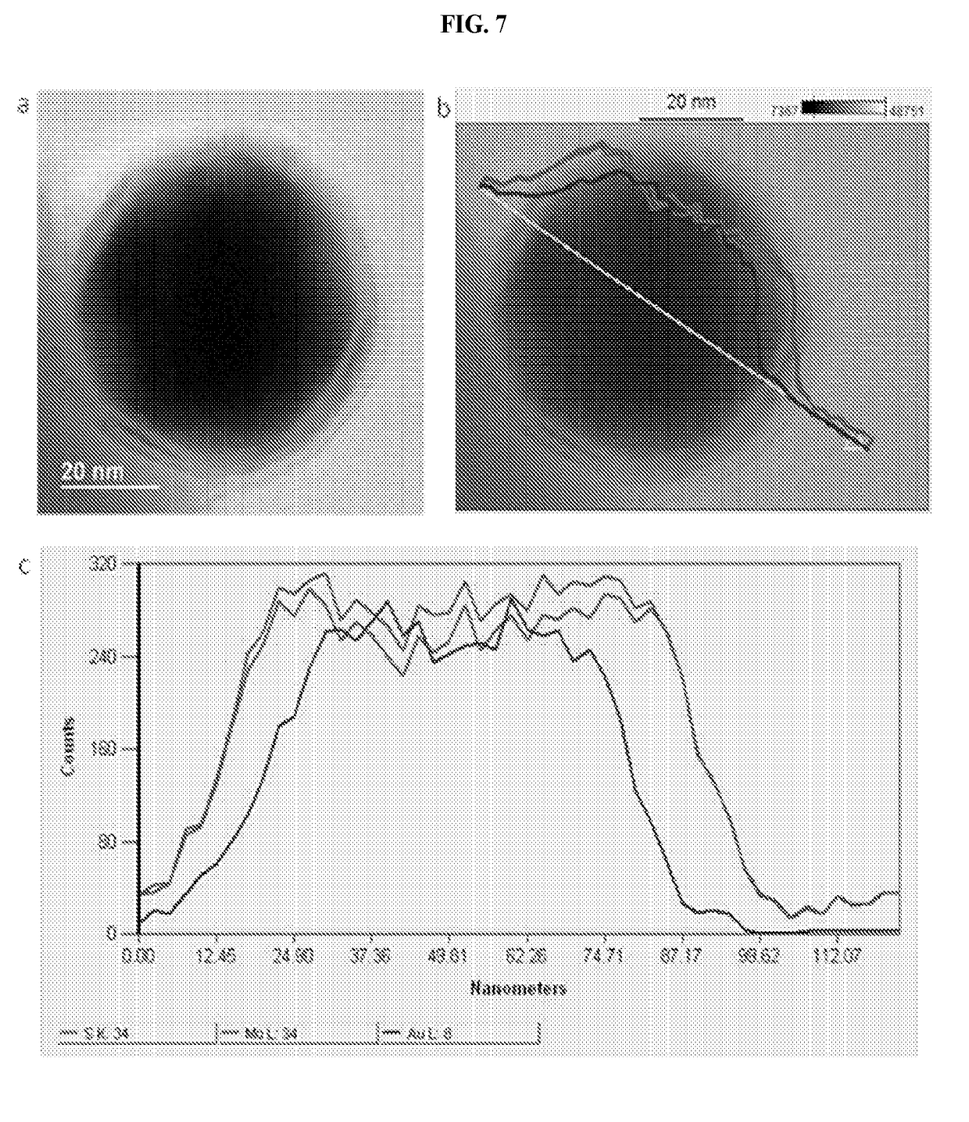
FIG. 7. EDS line profile of Au@MoS$_2$. (a) TEM image of a Au@MoS$_2$ heterostructure. (b) EDS line profiles marked on the Au@MoS$_2$ heterostructure. (c) Count-position curves of different elements corresponding to various EDS lines across the yellow line in (b).

The Au@$MoS_2$ core-shell heterostructures are shown in FIGS. 1d and e. From the TEM image it is observed that the $MoS_2$ shell have a multilayer structure, typically consisting of 5-10 atomic layers of S—Mo—S. The high-resolution TEM image in FIG. 1f indicates a layer-to-layer spacing of 0.65±0.02 nm, which is consistent with the c-axis lattice spacing of bulk $MoS_2$. No significant change in this spacing value was observed (e.g. due to the lattice strain induced by the shell curvature). Diffraction pattern of the heterostructures are shown in FIG. 1g, indicating the presence of dominant facets Au (111), Au (310), $MoS_2$ (200), $MoS_2$ (110) and $MoS_2$ (100). EDS elemental mapping for the heterostructures is further demonstrated in FIG. 1h-k. One can observe that the Au map region (FIG. 1i) is slightly smaller than that of Mo and S (FIGS. 1j and k), indicating the encapsulation of $MoS_2$ shell on Au nanoparticles. Similar to this elemental mapping, a result of EDS line profile is also displayed in FIG. 7, which demonstrates the variation of elemental distribution across a single Au@$MoS_2$ heterostructure.

Figure 2:
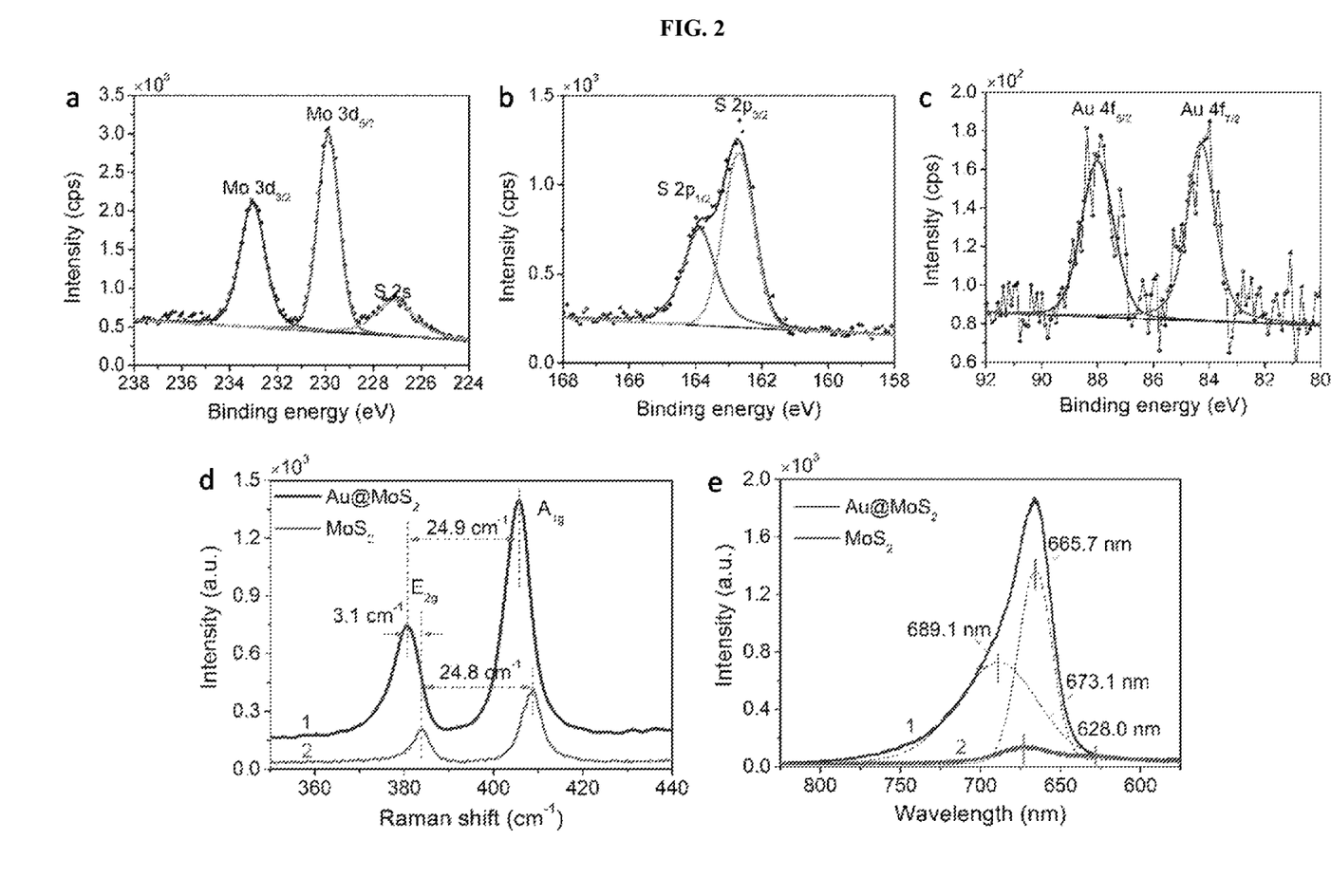
FIG. 2. Spectroscopic characterization of Au@MoS$_2$ heterostructures. (a-c) XPS peaks of Mo 3d (a), S 2p (b), and Au 4f (c). (d) Raman spectra and (e) Photoluminescence spectra of the Au@MoS$_2$ heterostructures and multilayer MoS$_2$ sheet (with comparable thickness to Au@MoS$_2$) on Si substrate.

X-ray photoelectron spectroscopy (XPS) was used to determine the chemical composition and chemical states of the Au@$MoS_2$ heterostructures. FIG. 2a displays Mo 3d peaks at 233.04 eV and 229.87 eV, corresponding to the $3d_{5/2}$ and $3d_{3/2}$ doublet. Meanwhile, the S 2p peak can be deconvoluted into two peaks at 163.88 eV and 162.70 eV (FIG. 2b), attributing to the $2p_{1/2}$ and $2p_{3/2}$ orbital. These binding energy values confirm the expected charge states of $Mo^{4+}$ and $S^{2-}$ in the $MoS_2$ shell. Additional peaks of metallic Mo or $MoO_x$ in higher/lower binding energy regions were not observed, which attests to the quality of $MoS_2$ shell obtained from the CVD growth. Moreover, Au 4f peaks were observed at 88.00 eV ($4f_{5/2}$) and 84.29 eV ($4f_{7/2}$). However, the intensity of these two peaks is relatively weaker compared with above Mo and S peaks due to the limited detection depth of X-ray photoelectrons (typically less than ~10 nm). This further indicates Au nanoparticles on the substrate are well-encapsulated by $MoS_2$ shell.

Raman spectroscopy allows for determination of the crystallinity and layer thickness of two-dimensional $MoS_2$ by measuring the position and frequency difference of two characteristic vibration modes, $E_{2g}$ and $A_{1g}$. The $E_{2g}$ mode is attributed to the in-plane vibration of Mo and S atoms, while the $A_{1g}$ mode is related to the out-of-plane vibration of S atoms. FIG. 2d shows the Raman spectra of the Au@$MoS_2$ heterostructures as well as a flat multilayer $MoS_2$ sheet grown on Si substrate. The measurements were conducted using a Neon laser (532 nm) with power of 8.8 µW to eliminate the effect of optical heating. The Au@$MoS_2$ heterostructures show the two vibration modes centered at 380.7 $cm^{-1}$ and 405.6 $cm^{-1}$ while the multilayer $MoS_2$ sheet exhibits modes at 383.8 $cm^{-1}$ and 408.6 $cm^{-1}$. Both spectra give similar $E_{2g}$-to-$A_{1g}$ frequency difference of ~24.8-24.9 $cm^{-1}$. This value is slightly smaller than that of bulk $MoS_2$, indicating their multilayered crystal structure. Raman spectroscopy is also utilized to investigate the effect of lattice strain, doping levels, and the van der Waals interaction at the interface of 2D crystals. The in-plane Raman mode, $E_{2g}$, is sensitive to the built-in strain of 2D $MoS_2$ while the out-of-plane mode, $A_{1g}$, is a reflection of interlayer van der Waals interactions. Thus, it is reasonable to conclude that the red-shift of $E_{2g}$ and $A_{1g}$ modes of the Au@$MoS_2$ heterostructures in FIG. 2d is attributed to the effect of lattice strain due to the curvature of $MoS_2$ shell. Besides the variation of Raman frequency, we also observed a significant enhancement of the peak intensity in our Au@$MoS_2$ heterostructures (FIG. 2d). This is attributable to the effect of localized surface plasmon resonance (LSPR) of Au nanoparticle cores, typically called surface-enhanced Raman scattering (SERS). Interactions of incident light with Au nanoparticles excites localized surface plasmons. When the frequency of plasmon oscillation is in resonance with the irradiation, a strongly enhanced electromagnetic field forms on the surface, leading to a significant increase in the intensity of Raman models as indicated in FIG. 2d.

Similar plasmonic enhancement was also observed in the photoluminescence emission. As shown in FIG. 2e, the multilayer $MoS_2$ sheet reveals an A peak at 673.1 nm and another B peak at 628.0 nm. The A peak is due to neutral exciton emission from the interband transition at the Brillouin zone K point while the B peak arises from exciton emission from another direct transition between the conduction band and a lower-lying valence band. However, this B peak is not observed in the Au@$MoS_2$ heterostructures. Its photoluminescence spectrum shows an intensity of ~13.6 times higher than that of the flat multilayer $MoS_2$ sheet, and exhibits the A peak at 666.2 nm and another $A^-$ peak centered at 689.1 nm. The evolution of $A^-$ peak is associated with the recombination of negatively charged excitons through the A transition ($A^-$, a free electron bound to a neutral exciton via Coulomb interaction). This $A^-$ is attributable to the Au nanoparticle cores, which provide a high level of trapped donors on the surface. In addition, the lattice strain in $MoS_2$ nanosheets may lead to a red-shift of A exciton peak. However, such red-shift was not observed on the Au@$MoS_2$ heterostructures. Instead, a slight blue-shift with significantly increased intensity was observe as compared to the A peak of flat multilayer $MoS_2$ sheet (FIG. 2e).

Experimental and simulation investigations were conducted to study light-induced absorption and surface electric field distribution. FIG. 3a shows an optical microscopic image of Au nanoparticles decorated on Si substrates before (1) and after (2) growth of $MoS_2$ shell. UV-vis Reflectance spectrum was collected on the Au@$MoS_2$ sample (2) and further converted into Absorbance (FIG. 3b). A broad absorption peak was observed from 500 nm to 750 nm. The deconvoluted subcomponents clearly show the A and $A^-$ peaks at ~660 nm and ~685 nm, which is well-consistent with the photoluminescence spectrum of Au@$MoS_2$ heterostructures in FIG. 2E. The absorption peak located at ~580 nm corresponds to surface plasmon resonance from Au nanoparticle cores. Another absorption shoulder appeared at ~425 nm is attributed to the C excitonic transitions of $MoS_2$, which further confirms its band structure in 2H crystal polytype.

Simulated absorbance spectrum of a single Au@$MoS_2$ heterostructure (Au core of 50 nm with a $MoS_2$ shell of 10 atomic layers, see FIG. 3e) is displayed in FIG. 3b. The simulation was conducted using Discrete Dipole Approximation (DDA) method. The simulated spectrum is consistent with the experimental data. However, since the plasmon hot electron induced charge transfer (doping effect) is not considered in our DDA simulation (which mainly considers the surface plasmon induced light-matter interactions), the $A^-$ transition peak was not observed in the simulated spectrum. Moreover, the C transition was blue-shifted by ~75 nm, which his attributable to quantum size effect from the reduction in the lateral size of $MoS_2$ nanostructures to less than 50 nm. The simulation was also conducted on a bare Au nanoparticle of 50 nm (FIG. 3d) and an imaginary 10-layer $MoS_2$ shell with inner diameter equals to 50 nm (FIG. 3f). The obtained Absorbance spectra are shown in FIG. 3c. A significant red-shift was observed of the LSRP peak from bare Au nanoparticle to the Au@$MoS_2$ heterostructure. This has been attributed to strong plasmon-exciton coupling between Au and $MoS_2$. The imaginary $MoS_2$ shell exhibits pronounced C and D excitonic peaks, however the A peak is very weak due to the low optical cross sections of few-layer $MoS_2$. This further indicates the importance of the inner Au nanoparticle core.

The distribution of surface electric field on various targets in FIG. 3d-f was also calculated to demonstrate above field enhancement on Raman scattering and photoluminescence emission. FIG. 3g shows a typical electric field map on the surface of Au nanoparticles with a maximum normalized electric field strength ($|E/E_0|^2_{max}$) of 6.40. However, on the Au@$MoS_2$ heterostructure, it was found that the electric field was mainly confined within the $MoS_2$ shell (FIG. 3h), with a slightly increased $|E/E_0|^2_{max}$. The strongest electric field "hot spots" mostly accumulate at the interface of Au and $MoS_2$ due to the plasmon-exciton coupling. The electric field on the imaginary $MoS_2$ shell is also confined inside its shell, however, the intensity is much lower. This well-explains the significant field enhancement of Raman and photoluminescence emission in FIGS. 2d and e and indicates useful applications of the Au@$MoS_2$ heterostructures, for instance, in future plasmonic transistors and emitters.

Example 3

Au@$MoS_2$ Patterns

Figure 4:
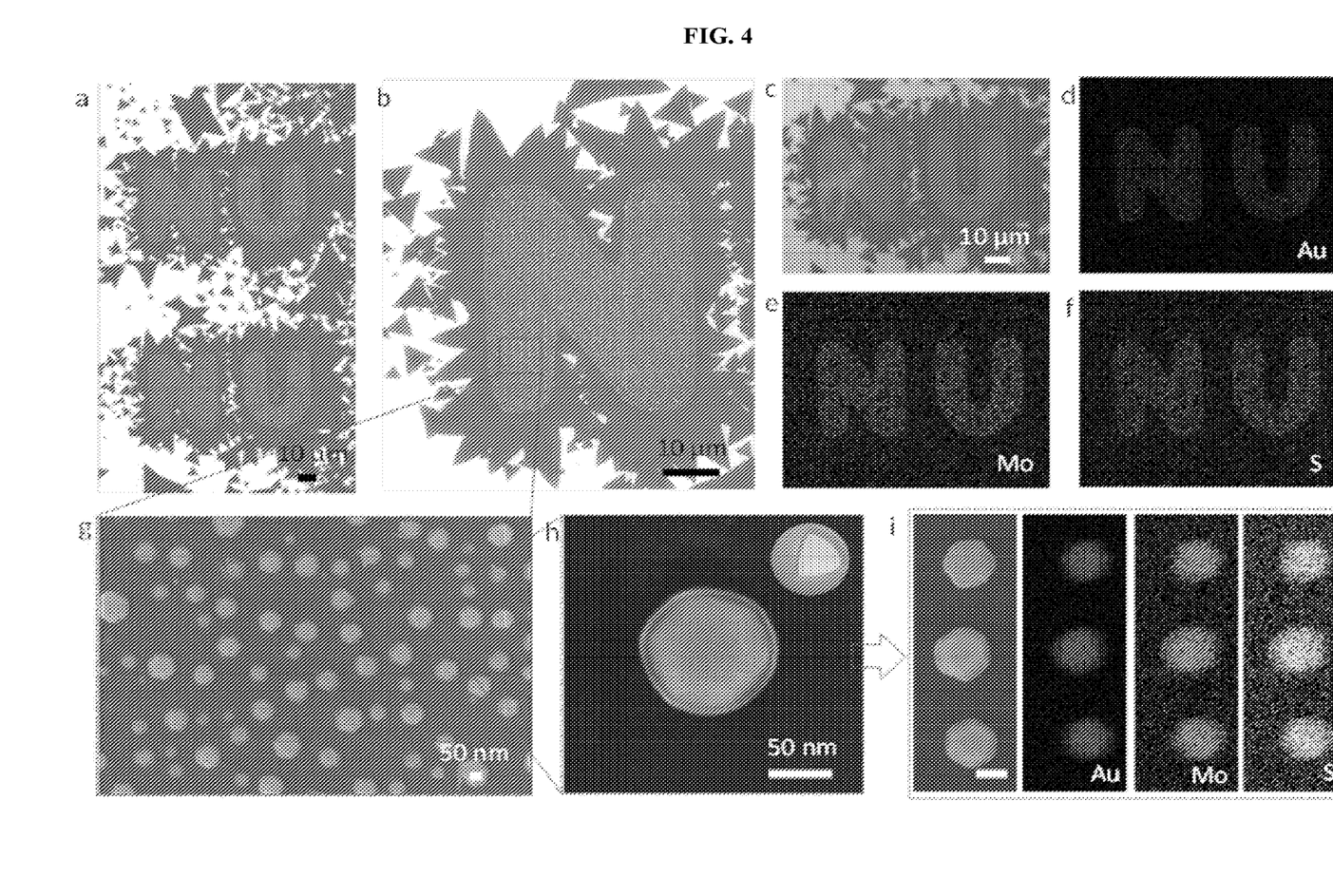
FIG. 4. Fabrication of Au@MoS$_2$ patterns. (a,b) SEM images of "NU" Au@MoS$_2$ patterns. (c-f) EDS elemental mapping on one Au@MoS$_2$ pattern. (g-i) SEM images and corresponding EDS elemental mapping of Au@MoS$_2$ heterostructures in the "NU" patterns.
Figure 8:
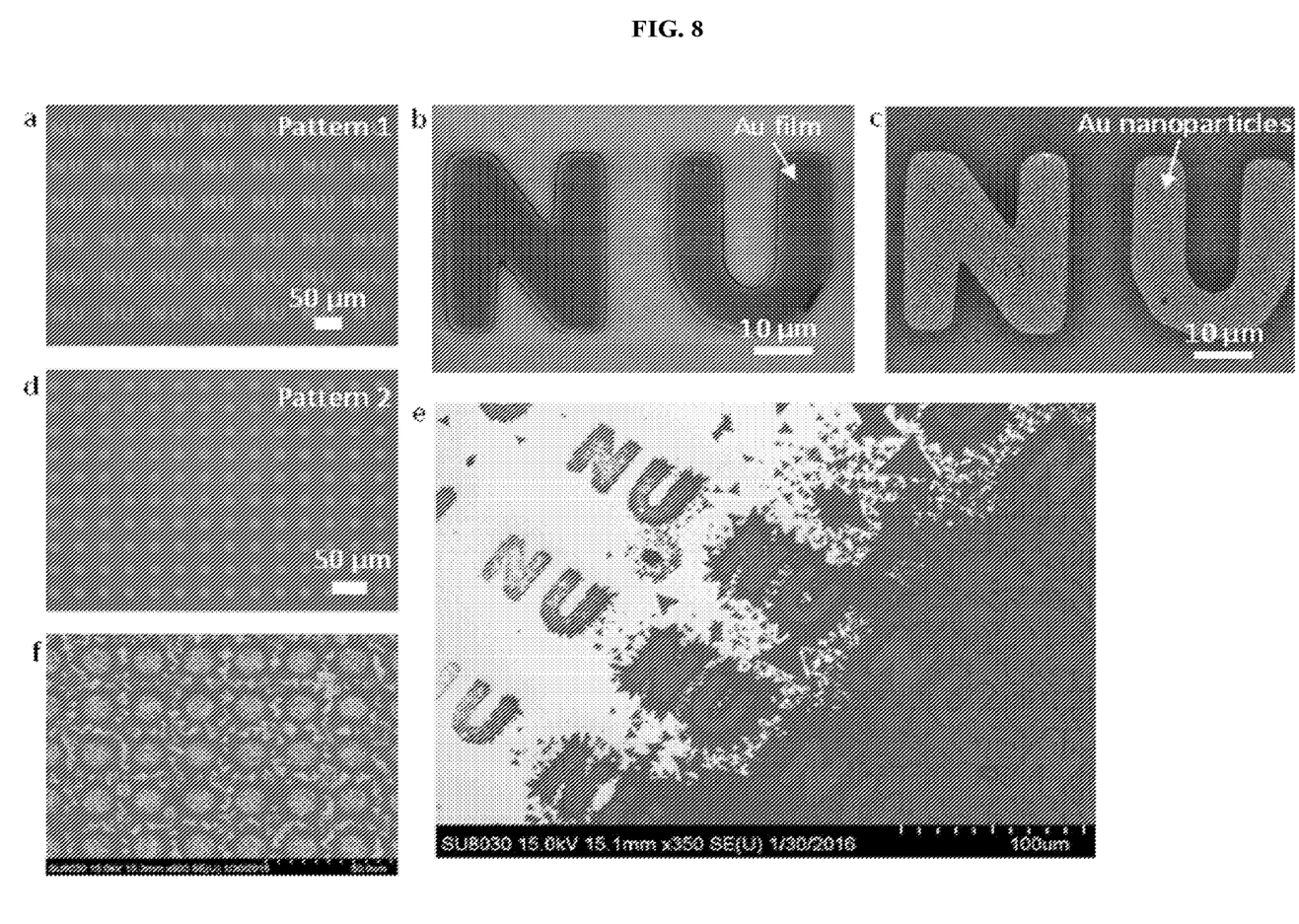
FIG. 8. Fabrication process of Au@MoS$_2$ patterns. (a) Optical image and (b) SEM image of "NU" patterns after galvanic deposition. (c) "NU" patterns after annealing. (d) Optical image of circular patterns with diameter of 10 μm. (e,f) Growth of Au@MoS$_2$ using above patterns.
Figure 9:
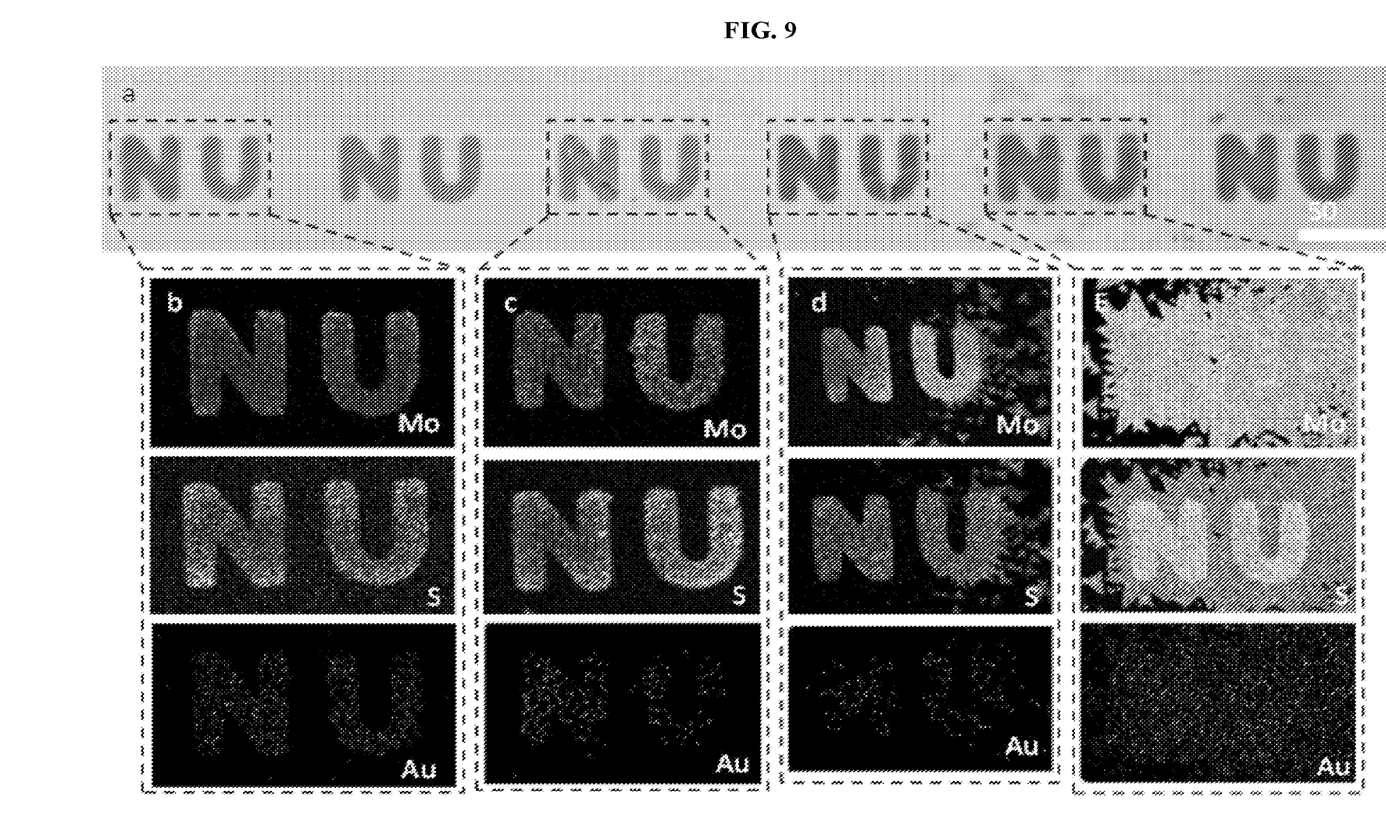
FIG. 9. SIMS demonstration of the Au@MoS$_2$ patterns. (a) Optical image of various "NU" at the edge region of Si substrate. (b-e) SIMS elemental mapping (including Mo, S, and Au) on various patterns.
Figure 10:
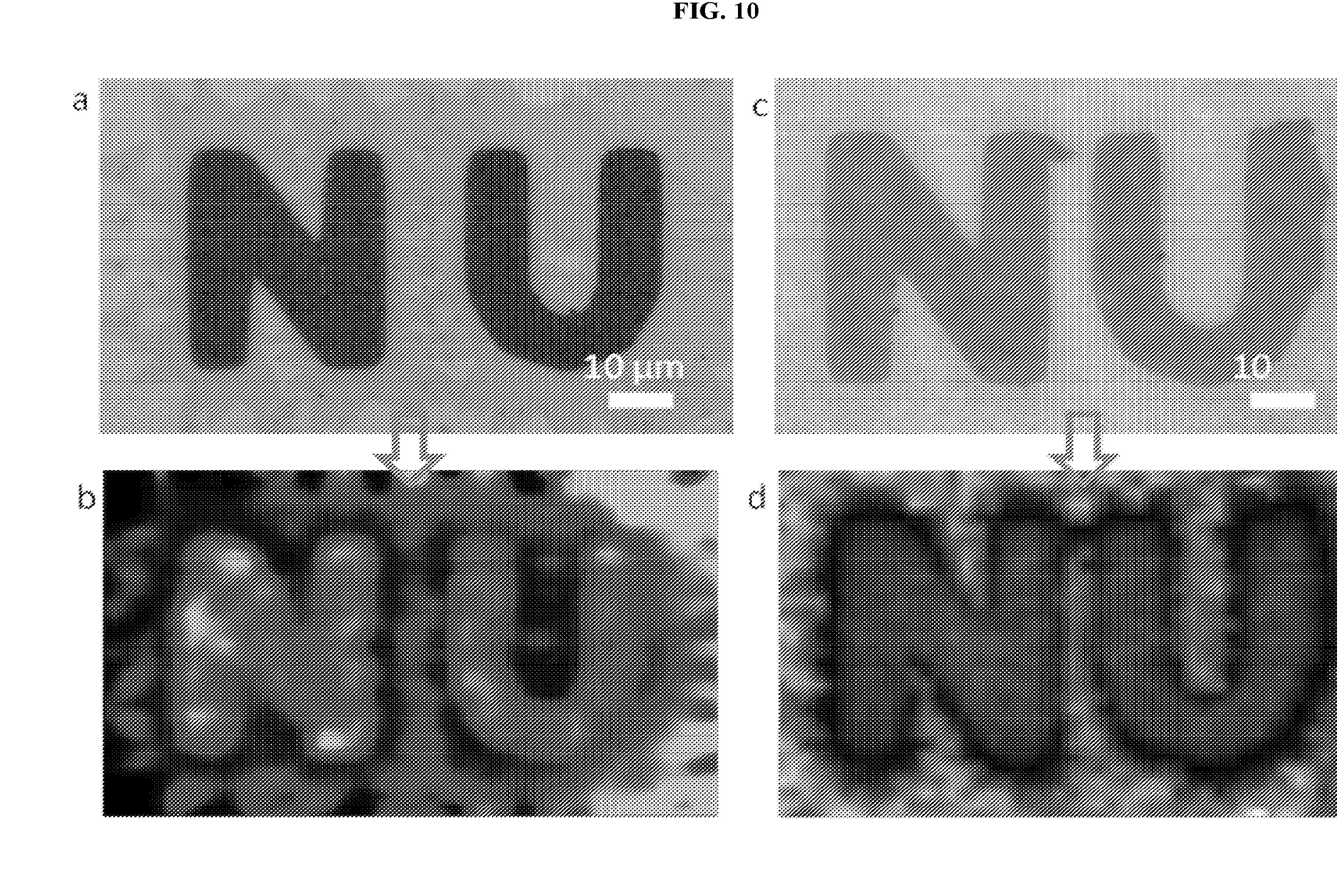
FIG. 10. Photoluminescence mapping on various Au@MoS$_2$ patterns. (a,b) photoluminescence mapping with relatively low resolution on another "NU" patterns. (c,d) "NU" patterns at the center region of the substrate.

In some embodiments, the Au@$MoS_2$ heterostructures are fabricated on Si substrate with specific patterns, giving an additional level of control over the architecture and geometry. This this allows for the use of the heterostructures in light-driven applications such as SERS, imaging, and phototransistors. The fabrication steps were demonstrated in FIG. 8 "NU" patterns of Au film were fabricated on a Si substrate (FIGS. 8a and b) using a photolithography method. This was followed by the same air-annealing process (850° C. for 15 min) to form Au nanoparticles (FIG. 8c). Chemical vapor deposition was further carried out on the pattered substrate, resulting in the formation of Au@$MoS_2$ patterns in "NU" shape (FIG. 8d). It was observed that isolated triangle islands of $MoS_2$ were formed in the blank regions (with no Au nanoparticles) of the Si substrate. On the region near the solid-state precursors, the islands merged into continuous films. Enlarged images of individual "NU" patterns are shown in FIGS. 4a and b. It was found that the presence of Au nanoparticles has a heterogeneous seeding effect, which induces the extended lateral growth of triangle $MoS_2$ films from NU patterns. To further support these findings, disk-like patterns (20 μm, FIG. 8e) of Au nanoparticles were also fabricated using the same lithography process. Au@$MoS_2$ patterns with similar laterally-grown $MoS_2$ flakes were obtained after the chemical vapor deposition (FIG. 8f). Elemental composition characterization of the Au@$MoS_2$ patterns was conducted by EDS mapping (FIG. 4c-f), which indicates the presence of Au (only within the patterns), Mo, and S. SEM image of a local region inside the Au@$MoS_2$ pattern is further demonstrated in FIG. 4g, in which a single Au@MoS₂ heterostructure is also shown in FIG. 4h, indicating its core-shell geometry as described above. EDS mapping was conducted on three individual Au@MoS₂ heterostructures. The obtained elemental maps in FIG. 4i confirm the chemical composition of Au@MoS₂ core-shell inside the patterns. SIMS elemental mapping was also conducted on a large region of the substrate, and the results are displayed in FIG. 9.

Raman spectra (FIG. 5a) were collected on various spots of the Au@MoS₂ patterns (as marked in FIG. 5b). Raman peaks obtained on the extended MoS₂ flakes show relatively weak intensity with a frequency difference of 20.7 cm$^{-1}$, which indicates their few-layer structure. The Raman signals on Au@MoS₂ heterostructures are similar to those shown in FIG. 2d, with a frequency of 24.2 cm$^{-1}$ for multilayered MoS₂ structure. The significantly enhanced Raman intensity is attributed to the presence of LSPR as demonstrated above. Raman mapping was further conducted on the Au@MoS₂ pattern (FIG. 5c). Consistently enhanced Raman signals were observed on the Au@MoS₂ patterned regions, indicating the Au@MoS₂ heterostructures are a substrate material for SERS and other plasmonic imaging systems.

Photoluminescence emission spectra were also collected from the same spots. The blue spot on Au@MoS₂ heterostructures shows increased intensity as compared to these few-layer MoS₂ flakes (the black and red spots) due to the field enhancement. It is also worth noting that the photoluminescence on the red spot is much weaker than that on the black spot, showing an obvious photoluminescence quenching effect. This phenomenon was further confirmed by the photoluminescence map shown in FIG. 5e, as the regions surrounding the "NU" pattern consistently show suppressed photoluminescence emission. The suppression of photoluminescence signal is attributable to charge transfer induced by the p-type doping effect of Au cores, which is similar to that observed in FIG. 2e (the emergence of A$^-$ excitations). Thus, incorporating Au in MoS₂ shell leads to both field enhancement effect and p-type doping effect. The final photoluminescence emission is a comprehensive result of both process. Since the electric field was mainly confined in the MoS₂ shell (FIG. 3h), a significant photoluminescence enhancement was observed on the Au@MoS₂ pattern. However, in the lateral MoS₂ flake surrounding the pattern, field enhancement is weak, and thus a quenched photoluminescence signal was observed.

Figure 11:
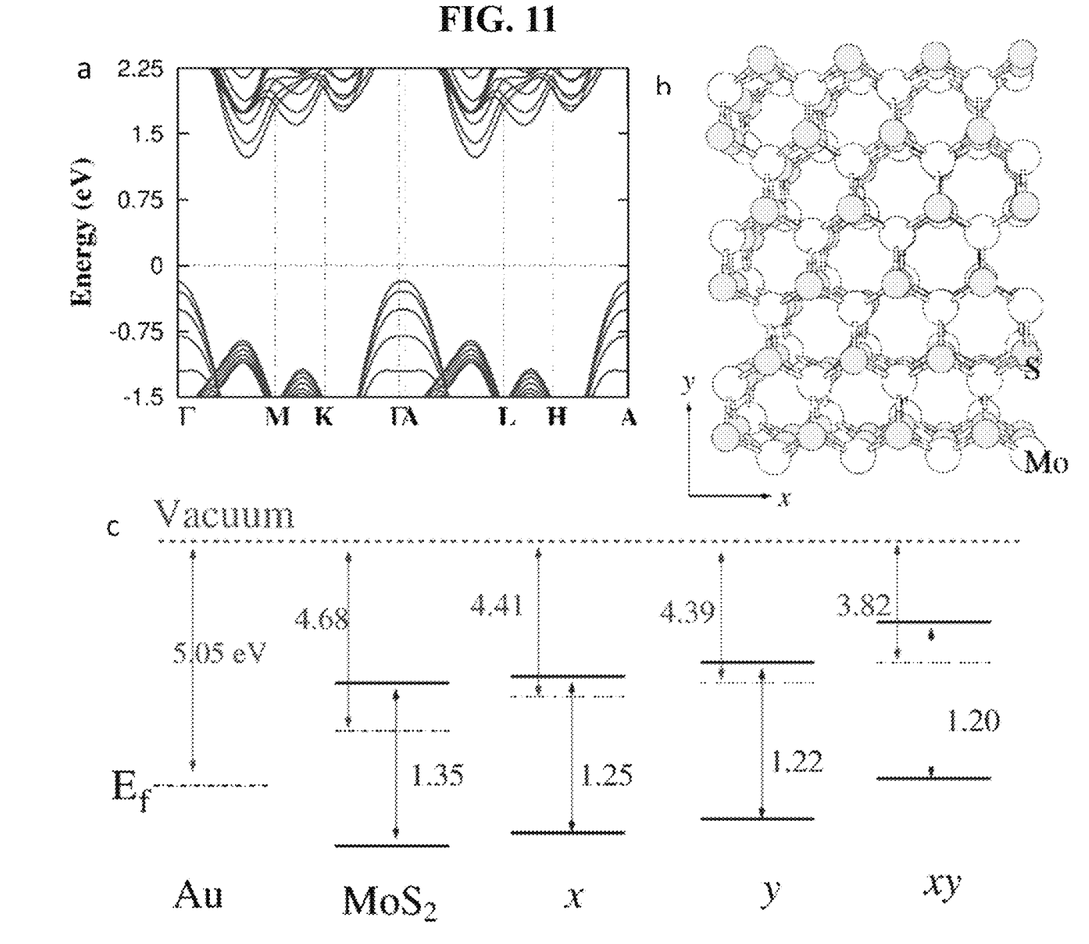
FIG. 11. Density functional theory modeling of electronic structure. (a) Band structure of 6-layer MoS$_2$ flat nanosheet. (b) Atomic structure of MoS$_2$ nanosheet used for the DFT calculation. The x-y coordinate shows the direction for structural bending. (c) Schematic diagram of band alignment of Au and various MoS$_2$ systems relative to the vacuum energy level. For energy levels of MoS$_2$ from left to right, they are respectively pure 6-layer MoS$_2$ slab, a bent MoS$_2$ in x, y and xy directions to mimic curved shell structure on Au particles. Here the bent structure refers a curve slab with 5° center angle. All numbers are in eV. The black dashed lines are Fermi levels.

To better understand such charge-transfer induced p-type doping, density functional theory (DFT) electronic structure calculations were conducted to reveal the band alignments due to the direct combination of Au and MoS₂. A 6-layer MoS₂ sheet with and without curvature were considered. The obtained band structure of the flat MoS₂ is shown in FIG. 11a, suggesting an indirect band gap of 1.35 eV. The MoS₂ sheet was further bent in x, y, and xy direction as illustrated in FIG. 11b to introduce curvature into the system. The obtained band alignment for Au and several bent/unbent MoS₂ structures were shown in FIG. 11c. The Fermi level of flat MoS₂ (~4.7 eV) is slightly higher than that of Au nanoparticles (~5.1 eV). The introduction of structural curvature leads to decrease of Fermi levels of MoS₂, suggesting electron transfer from the conduction band of MoS₂ to Au would be facilitated. Schematic in FIG. 5f illustrates the band structure of individual Au and MoS₂. Their direct combination results in a realigned Fermi level with significant band bending effect (FIG. 5g). Under illumination, the excited electrons on the conduction band, instead of decaying back to the ground state, are prone to transfer to the Au core. This leaves numerous holes in the valence band (p-doping effect) and explains the photoluminescence quenching effect observed in FIG. 5d.

The invention claimed is:

1. A heterostructure composition comprising a metal core encapsulated within a transition metal dichalcogenide (TMD) shell, wherein the metal core is a noble metal core, wherein the noble metal core comprises a single phase or alloy of gold (Au), silver (Ag), platinum (Pt), Palladium (Pd), Ruthenium (Ru), Rhodium (Rh), Iridium (Ir), or Osmium (Os), wherein the TMD shell comprises molybdenum disulfide (MoS₂), tungsten disulfide (WS₂), rhenium disulfide (ReS₂), molybdenum diselenide (MoSe₂), tungsten diselenide (WSe₂), or Molybdenum ditelluride (MoTe₂), wherein the metal core is 5-200 nm in diameter; and wherein the TMD shell is 0.65-32.5 nm thick.

2. The composition of claim 1, wherein the noble metal core comprises gold (Au).

3. The composition of claim 1, wherein the TMD shell comprises MoS₂, MoSe₂, or MoTe₂.

4. The composition of claim 1, wherein the TMD shell comprises WS₂ or WSe₂.

5. The composition of claim 1, wherein the TMD shell comprises 1-50 layers.

6. A method for preparing the composition of claim 1 comprising directly growing a monolayer or multilayer of the TMD shell on the metal core.

7. The method of claim 6, wherein the monolayer or multilayer TMD shell is grown by chemical vapor deposition.

8. The method of claim 6, wherein the metal core is formed by coating a metal film onto a Si substrate via galvanic deposition or physical evaporation followed by high-temperature annealing.

9. The method of claim 8, wherein the metal-coated Si substrate is placed in a tube furnace and transition metal oxide and sulfur powder is carried over the substrate to form the TMD shell on the metal core.

10. A photodetector device comprising the composition of claim 1.

11. A composition comprising the composition of claim 1 patterned onto a substrate.

* * * * *